July 8, 1969 V. H. SIEGEL 3,454,891

CHARGE AMPLIFIER WITH PROTECTIVE DISCHARGE DEVICE

Filed March 2, 1965

INVENTOR
VERNON H. SIEGEL

BY LeBlanc and Shur
ATTORNEYS

United States Patent Office 3,454,891

Patented July 8, 1969

3,454,891

CHARGE AMPLIFIER WITH PROTECTIVE DISCHARGE DEVICE

Vernon H. Siegel, Snyder, N.Y., assignor to Kistler Instrument Corporation, Clarence, N.Y., a corporation of New York Filed Mar. 2, 1965, Ser. No. 436,583
Int. Cl. H03f 3/04, 3/68, 3/14
U.S. Cl. 330—24 9 Claims

ABSTRACT OF THE DISCLOSURE

Disclosed is a charge amplifier for coupling charge sources such as piezoelectric transducers to an output. The charge amplifier has a high gain and a large negative feedback acting to maintain the input at a virtual ground potential. The input stage is a high impedance device in the form of an insulated gate field effect transistor and this is protected by a neon tube connected across the input of the amplifier.

Figure 1:
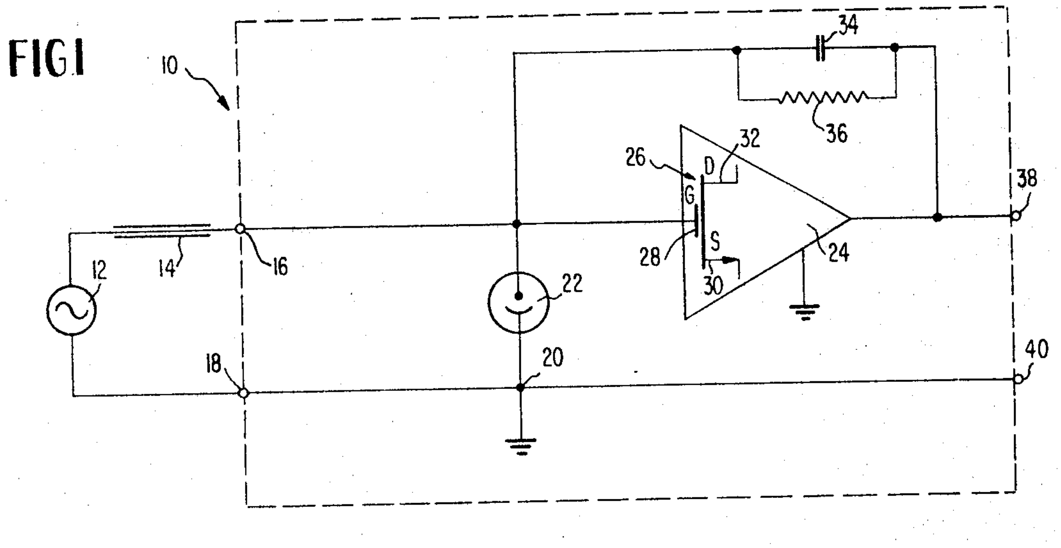

This invention relates to charge amplifiers and more particularly to a simplified amplifying circuit for coupling a charge source to an output load.

As is well known certain difficulties are encountered in attempting to couple a charge source of varying potential to an output load device and this problem is particularly aggravated in electrostatic measurements where it is frequently desired to couple a high impedance source such as piezoelectric transducer to a low impedance output device such as an oscilloscope or the like. These problems occur in the measurement of movement of machine parts by moving the plates of a capacitor or when it is desired to measure acceleration or other vibration phenomenon by means of piezoelectric crystals. The outputs from the transducers are in each case caused by the movement of spaced capacitor plates and are charges rather than currents. In the past because conventional vacuum tubes had a relatively low grid insulation the charge rapidly leaked off, necessitating the utilization of an amplifying device having as its first or input stage an electrometer tube. However, disadvantages accompanied the electrometer tubes, including the fact that they are microphonic, needed a battery power supply, and are conventionally usable only at low voltages.

These problems were substantially overcome by the provision of a device commonly referred to as a charge amplifier which made it possible to utilize conventional triode tubes as the input stage of the amplifier in place of the previous electrometer tubes for amplifying the outputs of pressure transducers, acceleration and force transducers, capacative sensors for moving machinery parts, and the like, which all act as AC charge sources. A circuit of this type is shown and described in Swiss Patent No. 267,431 published June 16, 1950.

More recently, with the advent of the transistor, it has been proposed to substitute a conventional junction transistor for the triode in a charge amplifier like that of the Swiss patent, in an attempt to gain the advantages of small size, light weight, and relative ruggedness common to transistors. However, these circuits too suffer disadvantages in that the common base input resistance of the transistor amplifier is quite low, even lower than a conventional triode, and this low input resistance tends to raise the low frequency cut off point of the amplifier thus limiting its use to input frequencies of above several cycles per second. In addition, the necessity of establishing bias for the transistor input requires the use of a fairly elaborate drift correction circuit including a low pass filter cutting off well below the frequency range of the amplifier so as to avoid excessive drift in the circuit.

By means of the present invention, the above disadvantages are substantially eliminated through the use of a charge amplifier utilizing for its input stage a high input resistance device such as a field effect transistor and more particularly an insulated gate field effect transistor, instead of a conventional junction transistor. Further, in the circuit of the present invention drift correction is obtained by simply connecting a high resistance, i.e., roughly on the order of the high input resistance of the field effect transistor, across the feed back capacitor. The result is a simplified, inexpensive and reliable amplifier having a low cut off frequency very closely approaching D.C. All the advantages attendant to the use of a transistor are obtained without the disadvantages accompanying the low input resistance of the conventional junction transistor, since the gated field effect transistor possesses a very high input resistance on the order of that of the electrometer tube and in some instances an even higher input resistance.

It is therefore one object of the present invention to provide a novel improved charge amplifier.

Another object of the present invention is to provide a novel improved amplifier circuit for coupling a charge source to a load.

Another object of the present invention is to provide a novel arrangement for connecting a transducer such as a piezoelectric accelerometer, pressure gage, force gage, or the like to an output device for indicating the force applied to the piezoelectric quartz elements of the transducer.

Another object of the present invention is to provide a novel arrangement for connecting a transducer such as a piezoelectric accelerometer, pressure gage, force gage, or the like to an output device for indicating the force applied to the piezoelectric elements of the transducer.

Another object of the present invention is to provide a charge amplifier utilizing a transistor having a high input resistance.

Another object of the present invention is to provide a charge amplifier utilizing a gated field effect transistor at its input stage.

Another object of the present invention is to provide an arrangement for protecting the input stage of a charge amplifier.

Another and related object of this invention is to provide a charge amplifier having its input shunted by a voltage responsive discharge device such as a neon tube to protect the amplifier from damage by stray signals including electrostatic charges.

Another object of the present invention is to provide a high input resistance charge amplifier having a simplified drift correction circuit.

Figure 2:
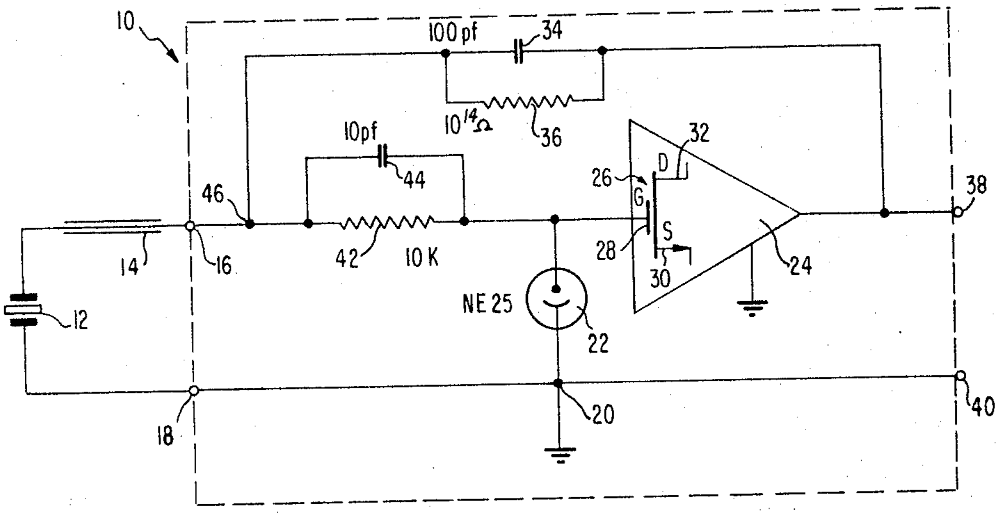

These and further objects and advantages of the invention will be more apparent upon reference to the following specification, claims, and appended drawings wherein:

FIGURE 1 is a simplified diagram showing one embodiment of the present invention, and FIGURE 2 is a simplified circuit diagram showing a preferred embodiment of the present invention.

Referring to the drawings, and especially to FIGURE 1, the charge amplifier indicated generally by the dashed box 10 is connected to a suitable A.C. charge source 12 which may comprise a pair of movable capacitive plates, a variable dielectric capacitor, or any other suitable charge source. However, it is contemplated in the present invention that the charge source 12 is a piezoelectric transducer such as those commonly used to measure acceleration, vibration, pressure, force and the like which generate a charge in proportion to the force applied to the piezoelectric element or elements of the transducer. These latter elements in the preferred embodiment comprise one or more quartz wafers, but other piezoelectric elements may be utilized including the various ceramic piezoelectric materials including barium titanate and the like.

Source 12 is illustrated as coupled to the amplifier 10 through a conventional low leakage cable generally indicated at 14, which connects the source to input terminals 16 and 18 of the amplifier, this latter terminal indicated as coupled to a ground at 20. In certain instances the amplifier 10 may be coupled directly to the transducer rather than connected through the cable 14. Connected across the input terminals 16 and 18 of the amplifier and forming an important feature of the present invention is a discharge device in the form of a neon tube 22 for a purpose more fully explained below.

Input terminal 16 is also connected to an amplifier 24 which has as its first or input stage a field effect transistor generally indicated at 26, including the conventional gate, source and drain electrodes 28, 30 and 32. Connected between the input and output of amplifier 24 is a negative feed-back capacitor 34 shunted by a relatively large resistor 36. The output to the load is by way of output terminals 38 and 40.

Transistor 26 is of the high input resistance type, i.e., a field effect transistor having an input resistance of at least $10^{10}$ ohms, and in the preferred embodiment consists of an insulated gate field effect transistor having an even higher input resistance, i.e., at least $10^{14}$ ohms and preferable about $10^{15}$ ohms. Resistor 36 preferably has a resistance value on the order of the input resistance of the transistor 26, i.e., from about $10^{10}$ to about $10^{14}$ ohms and preferably at least $10^{11}$ ohms. Capacitor 34 corresponds roughly in value to the capacitance of the charge source 12 and typically it may have a value of from 1 to 50,000 picofarrads. Values of from 100 to 1000 picofarrads are most common.

The action of the amplifier 10, as explained in the aforementioned Swiss patent, is such that almost all of the charge generated at source 12 appears across capacitor 34 and across the output terminals 38 and 40, and is given by the equation $$e_o \simeq \frac{-q}{C}$$

where $e_0$ is the output voltage, $q$ is the charge from source 12, and C is the capacitance of the capacitor 34. The amplifier which is preferably but not necessarily direct coupled has a very high gain and is heavily fed back through capacitor 34 such that the amplifier input is held at or near a virtual ground potential by feedback.

While its high input impedance (and accompanying high input resistance) is quite desirable in the charge amplifier circuit of this invention, it has been found that the insulated gate field effect transistor is subject to being destroyed in the circuit of the present invention by stray electrostatic voltages applied to its input. For example, it has been found that when the amplifier 10 is simply plugged into the cable 14, accumulated electrostatic charge from the source and the cable is very often sufficient to burn out the transistor 26. In order to avoid this problem applicant incorporates a protective discharge device in the form of a neon bulb 22 having a breakdown value on the order of 70 volts. In this way any stray electrostatic charge accumulated on the cable or emanating from the transducer 12 simply causes the tube 22 to momentarily break down and is immediately shorted to ground through the discharge tube without damaging the input stage of the amplifier 24.

While the circuit illustrated in FIGURE 1 is quite satisfactory in many applications and gives protection in the milliwatt range, a preferred form of the present invention is illustrated in FIGURE 2, which discloses an arrangement providing protection for stray inputs on the order of watts. In FIGURE 2 like parts bear like reference numerals and again the amplifer itself is indicated by the dashed box 10. In this embodiment substantially increased protection is provided by connecting the cable 14 to the gate 24 of amplifier 26 by way of a parallel resister 42 and capacitor 44. At the same time, instead of returning the feedback resistor 36 and feedback capacitor 34 to the input gate 28 of amplifier 26, these feedback elements are returned to a point 46 intermediate the input terminal 16 and the parallel resistor 42 and capacitor 44. This particular arrangement insures not only the increased protection (i.e., watts instead of milliwatts), but likewise insures that the circuit will not go into undesirable oscillations. Preferred values for the circuit parameters are illustrated in FIGURE 2 by way of example only, and these may be varied in accordance with the particular application. In general, resistor 36 has a resistance on the order of the input resistance of amplifier 26, i.e., $10^{14}$ ohms for the gated field effect transistor illustrated.

In one embodiment constructed in accordance with the present invention neon tube 22 was a high insulation type identified as NE2S. Tubes of this type are currently manufactured by several companies including General Electric and Signalite, and possess a breakdown voltage on the order of 70 volts. Likewise, in the embodiment illustrated in FIGURE 2 the input stage of the amplifier 24 consisted of an insulated gate field effect transister of the high voltage type referred to as type X1004, manufactured by the General Microelectronics Corporation, Santa Clara, Calif. Other commercial gated field effect transistors may also be utilized.

It is apparent from the above that the present invention provides a novel charge amplifier for coupling piezoelectric A.C. sources to loads. The amplifier operates over a very wide frequency range with good linearity all the way down to almost zero frequency, that is, almost down to D.C. This low frequency cut-off is made possible by the utilization of an input transistor having a very high input resistance in conjunction with a simplified drift correction circuit consisting simply of a resistor in shunt with the feedback capacitor.

The invention may be embodied in other specific forms without departing from the spirit or essential characteristics thereof. The present embodiments are therefore to be considered in all respects as being illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A charge amplifier comprising a high gain amplifier, a heavily fed back negative feed back capacitor coupled between the input and output of said amplifier whereby said amplifier input acts as a virtual ground, said amplifier having an insulated gate field effect transistor as its input stage, a feed back resistor coupled in parallel with said capacitor, and a voltage responsive discharge device coupled across the input of said amplifier.

2. A charge amplifier according to claim 1 wherein said discharge device has a breakdown voltage of about 70 volts.

3. A charge amplifier according to claim 1 wherein said amplifier has a plurality of stages, said stages being direct coupled.

4. A charge amplifier comprising a high gain amplifier, a heavily fed back negative feed back capacitor coupled between the input and output of said amplifier whereby said amplifier input acts as a virtual ground, said amplifier having an insulated gate field effect transistor as its input stage, a feed back resistor coupled in parallel with said feed back capacitor, a current limiting resistor coupled to the gate of said transistor, and a protective discharge device coupled across the input of said transistor between said current limiting resistor and said transistor gate.

5. A charge amplifier comprising a high gain amplifier, a heavily fed back negative feed back capacitor coupled between the input and output of said amplifier whereby said amplifier input acts as a virtual ground, said amplifier having an insulated gate field effect transistor as its input stage, a feed back resistor coupled in parallel with said feed back capacitor, a current limiting resistor coupled between said amplifier input and the gate of said transistor, a second capacitor coupled in parallel with said current limiting resistor, and a protective discharge device coupled across the input of said transistor between said current limiting resistor and said transistor gate.

6. A measuring device comprising a piezoelectric transducer including a charge source, a charge amplifier, and means coupling said charge source to the input of said charge amplifier, said charge amplifier comprising a high gain amplifier, a heavily fed back negative feed back capacitor coupled between the input and output of said amplifier whereby said amplifier input acts as a virtual ground, said amplifier having an insulated gate field effect transistor as its input stage, a feed back resistor coupled in parallel with said feed back capacitor, a current limiting resistor coupled between said amplifier input and the gate of said transistor, a second capacitor coupled in parallel with said current limiting resistor and a protective discharge device coupled across the input of said transistor between said current limiting resistor and said transistor gate.

7. A device according to claim 6 wherein said coupling means comprises a cable between said transducer and said charge amplifier.

8. A measuring device comprising a charge source, a charge amplifier, and means coupling said charge source to the input of said charge amplifier, said charge amplifier comprising a high gain amplifier, a heavily fed back negative feedback capacitor coupled between the input and output of said amplifier whereby said amplifier input acts as a virtual ground, said amplifier having an insulated gate field effect transistor as its input stage, a feedback resistor coupled in parallel with said feedback capacitor, and a protective discharge device coupled across the input of said amplifier.

9. A device according to claim 8 wherein said coupling means comprises a cable.

References Cited

UNITED STATES PATENTS

| | | | |
|---|---|---|---|
| 2,822,430 | 2/1958 | Lin | 330—28 X |
| 3,260,950 | 7/1966 | Saari | 330—28 |
| 3,268,823 | 8/1966 | MacMillan | 330—9 X |
| 3,286,189 | 11/1966 | Mitchell el al. | 307—88.5 |
| 3,048,718 | 8/1962 | Starzec et al. | 307—93 |
| 3,289,093 | 11/1966 | Wanlass | 330—35 |
| 3,305,638 | 2/1967 | Teachout | 330—38 X |

OTHER REFERENCES

Levitre: Protection and Indicating Circuit, IBM Technical Disclosure Bulletin, vol. 2, No. 2, August 1959.

Ghausi et al.: A New Design Approach For Feedback Amplifiers, IRE Transactions on Circuit Theory, September 1961.

ROY LAKE, *Primary Examiner.*

L. J. DAHL, *Assistant Examiner.*

U.S. Cl. X.R.

330—38